OSCILLATOR CIRCUIT
Filed June 26, 1956
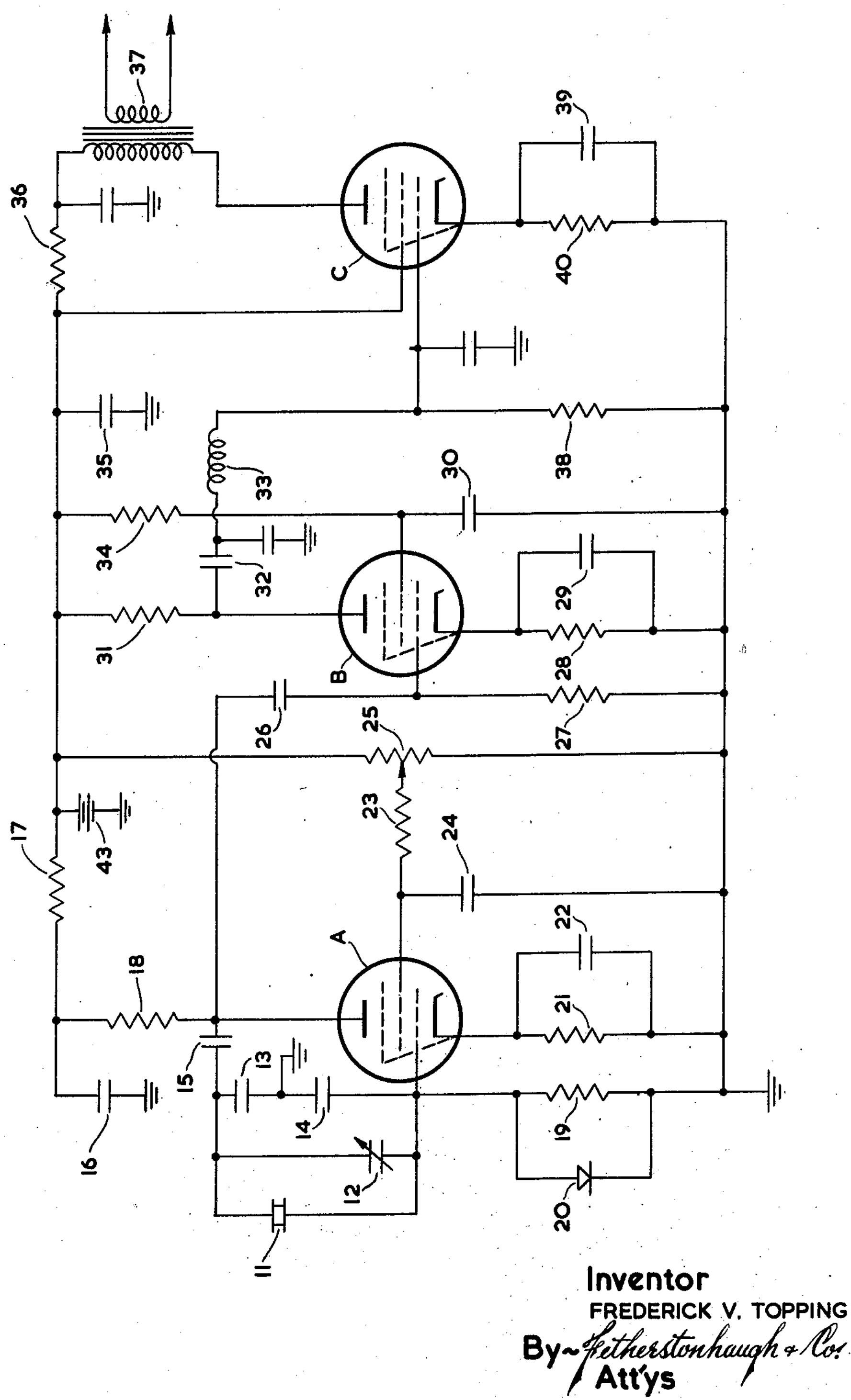
Inventor
FREDERICK V. TOPPING
By~Fetherstonhaugh & Co.
Att'ys United States Patent Office 2,823,314
Patented Feb. 11, 1958

2,823,314

OSCILLATOR CIRCUIT

Frederick Victor Topping, Toronto, Ontario, Canada, assignor to F. V. Topping, Electronics Limited, Toronto, Ontario, Canada Application June 26, 1956, Serial No. 593,966
1 Claim. (Cl. 250—36)

This invention relates to oscillators wherein a vacuum tube is coupled to a resonator (usually a crystal) and to amplifying systems coupled therewith, wherein the magnitude of the oscillation is limited by the voltage between the control grid and the cathode of the tube.

Two common types of oscillators wherein the oscillations are limited in such a way are the Pierce and Miller types. Oscillators of this type utilize a vacuum tube in combination with a resonator, generally a crystal and the control grid of such tube is connected to ground through a grid leak resistor.

In any such oscillator means must be provided whereby the amplitude of the oscillations may be limited. In prior oscillators such limiting is provided by the grid bias developed across the grid leak resistor due to the conduction between control grid and cathode when the control grid becomes or approaches a positive potential with respect to the cathode. The effect of such conduction has, however, been to introduce into the resonator circuit the rectification phenomena occurring between the control grid and cathode. Such phenomena take the form of unwanted and unpredictable reactance or resistance effects which when introduced into the resonator circuit result in undesirable variations in the output frequency of the resonator.

This invention therefore provides circuitry for oscillators of the type defined in paragraph two above wherein the limiting effect is obtained by providing a crystal diode rectifier between the control grid and ground which is independent of the tube grid and cathode. The crystal diode rectifier is oriented to conduct when the control grid is positive with respect to ground. In addition the tube cathode is connected to ground through a cathode bias resistor. The oscillations are therefore limited by the conduction of the diode whenever the control grid tends to become positive. Since the control grid and cathode of the tube are not used for rectification, no conduction takes place therebetween, hence the control grid-cathode resistance and reactance effects are not introduced into the oscillator circuit. Although there is a tendency in tubes for conduction to take place when the control grid potential is almost at, but less than the cathode potential, due to contact potential effects; such conduction is avoided in the novel circuit by the positive biasing of the cathode by its resistor which maintains a potential difference between cathode and grid, greater than the potential at which conduction could be initiated. The result is a more accurate oscillator than it has previously been possible to develop without complex circuitry.

Such an oscillator is coupled to an amplifier system so that a suggested arrangement would be: the oscillator stage, separated from the amplifier stage by a buffer stage, the buffer stage preventing load effects from being superimposed upon the oscillator circuit.

It is common to provide the amplifier with a tuned output circuit, the tuning being to the frequency of the oscillator. Thus if a crystal of a different frequency is substituted for the first crystal, retuning of the tuned circuit is required.

In an oscillator this retuning requires the inconvenience of added adjustments and the expense of added parts.

In accord with the present invention the output of the system is obtained from the secondary winding of an untuned transformer whose primary winding forms the plate load for the tube of the amplifier stage. Since the output is untuned there is thus no need for tuning when a crystal of different frequency is substituted and therefore no tuning apparatus is required.

The connection above described is used with class A amplification.

In a drawing which illustrates a preferred embodiment of the invention:

Three tubes A, B, C and their associated circuitry provide respectively an oscillator, a buffer and an amplifier stage.

In the oscillator stage the plate of tube A is supplied with positive potential from source 43 through isolation resistor 17 and plate voltage supply resistor 18. R. F. grounding is provided by condenser 16.

It will be noted that the plate voltage supply impedance of tube A is resistive instead of reactive thereby eliminating frequency dependent side effects which would vary the reactive loading of the crystal. The resistance 18 is of sufficiently high value to avoid appreciable resistive loading of the crystal.

The cathode is connected to ground through cathode bias resistor 21 and through radio frequency grounding condenser 22.

One side of a resonator (preferably a crystal) is connected to the plate through blocking condenser 15. The other side of the crystal or other resonator is connected to the control grid of tube A.

In parallel with the crystal is a variable condenser 12. Condenser 15 and one side of the crystal 11 are grounded through condenser 13 while the other side of the crystal is grounded through condenser 14. Variable condenser 12 in conjunction with condensers 13 and 14 form the load capacity for the crystal. Condensers 12 to 14 constitute the resonator load capacity.

The control grid of tube A is provided with a grid leak resistor 19 connected to ground. One of the novel features of this invention is the provision of a crystal diode rectifier in parallel with the grid leak resistor with the polarity arranged so that the rectifier conducts when the grid is positive with respect to ground. The addition of the crystal diode connected in this way has been found to add to the accuracy and/or stability of the oscillator.

It will be noted that the magnitude of the oscillations is limited by the fact that the crystal diode never allows the control grid to become more positive than ground potential. Since the cathode of the tube is biased positively by the cathode bias resistor, conduction between grid and cathode is avoided. Thus by the use of the crystal diode no grid-cathode resistance or reactance effects are introduced into the oscillator circuit.

The screen grid of the pentode is R. F. grounded by condenser 24. The positive source is connected to ground through a potentiometer resistor 25 which by its adjustable contact sets the potential of the screen grid. The adjustable contact is connected to the screen grid by series resistor 23 which is used to give the required $g_m$ characteristics to the tube and also to assist by-pass condenser 24 to return the radio frequency again to the common ground.

The buffer stage B is operated as a class A amplifier, it will be seen that the pentode therein receives a sinusoidal output of the oscillator stage at its control grid from the side of the crystal connected to the plate of the oscillator tube A. A sinusoidal output may also be derived from the side of the crystal connected to the control grid.

It is also possible to derive a pulsating output signal from the oscillator tube by conventional methods but if this is done elements (not shown) must be provided in buffer or amplifier stages to convert such pulsating signals to sinusoidal form.

The plate of the buffer pentode is connected to the positive potential source 43 by plate resistance 31. The cathode is grounded through cathode bias resistor 28 and also through R. F. by-pass condenser 29.

The control grid is grounded through grid load resistor 27 which in conjunction with the oscillator stage plate resistor 18 forms part of the resistive loading for the crystal 11.

Voltage for the screen grid of the buffer stage B is supplied through resistor 34 and the screen grid is R. F. by-passed by condenser 30.

Referring now to the amplifier stage C it is seen that the pentode therein receives the output of the oscillator stage at its control grid which receives the output from the plate of the buffer stage B. The plate of the amplifier C is connected to the positive source through the primary winding of an untuned transformer 37 and a de-coupling resistor 36. The plate is R. F. by-passed by condenser 40 and the de-coupling resistor is located between the voltage source and the primary winding.

A filter condenser 35 connecting the positive line to ground between source and resistor 26 assists in the de-coupling operation.

The cathode of the amplifier stage is connected to ground through cathode bias resistor 40 and R. F. by-pass condenser 39. The control grid is grounded through grid load resistor 38.

The oscillations so produced are supplied through the buffer stage to the amplifier from which the output is obtained at the secondary of transformer 37. Since this output is untuned there is no tuning required when the crystal frequency is changed by the substitution of a further crystal. Class A amplification is used in the amplifier stage.

It will be obvious that providing a crystal diode in parallel with the grid leak resistor of the oscillator stage in accord with the invention may not only be performed with a Pierce oscillator but also with a Miller oscillator and in fact with any oscillator system wherein the magnitude of the oscillations is limited by the voltage between control grid and cathode.

It should be noted that the crystal resonator used with the oscillator stage may be replaced by any other suitable resonator.

What I claim as my invention is:

In an oscillator including a resonator having a pair of terminals coupled to a vacuum tube of the class wherein the magnitude of the oscillations is limited by the voltage between control grid and cathode: a cathode bias resistor, a grid leak resistor connecting said control grid to ground, a crystal diode rectifier in parallel with said resistor, with its polarity arranged to conduct when the control grid is positive with respect to the ground, and a condenser connected between each of said resonator terminals and ground.

References Cited in the file of this patent

UNITED STATES PATENTS

| | | |
|---|---|---|
| 1,878,252 | Taylor | Sept. 20, 1932 |
| 1,980,581 | Goddard | Nov. 13, 1934 |
| 2,205,233 | Van Slotten | June 18, 1940 |
| 2,570,875 | Sink | Oct. 9, 1951 |

OTHER REFERENCES

Page 504 (Fig. 23) of Radio Engineers Handbook by Terman; 1943 edition.